US011483951B2

(12) United States Patent
Joshi et al.

(10) Patent No.: US 11,483,951 B2
(45) Date of Patent: Oct. 25, 2022

(54) SYSTEMS AND METHODS OF FORMING POWER ELECTRONIC ASSEMBLIES WITH COOLING CHANNELS AND INTEGRATED ELECTRODES

(71) Applicants: Toyota Motor Engineering & Manufacturing North America, Inc., Plano, TX (US); The Board of Trustees of the University of Illinois, Champaign, IL (US)

(72) Inventors: Shailesh N. Joshi, Ann Arbor, MI (US); Paul Braun, Champaign, IL (US); Julia Kohanek, Champaign, IL (US); Gaurav Singhal, Maharashtra (IN)

(73) Assignees: Toyota Motor Engineering & Manufacturing North America, Inc., Plano, TX (US); The Board of Trustees of the University of Illinois, Champaign, IL (US)

( * ) Notice: Subject to any disclaimer, the term of this patent is extended or adjusted under 35 U.S.C. 154(b) by 296 days.

(21) Appl. No.: 16/696,425

(22) Filed: Nov. 26, 2019

(65) Prior Publication Data
US 2021/0161026 A1 May 27, 2021

(51) Int. Cl.
*H05K 7/20* (2006.01)
*H01L 21/48* (2006.01)
(Continued)

(52) U.S. Cl.
CPC ......... *H05K 7/209* (2013.01); *H01L 21/4882* (2013.01); *H01L 23/3675* (2013.01); *C25D 5/02* (2013.01); *H01B 5/14* (2013.01)

(58) Field of Classification Search
CPC . H05K 7/209; H01L 21/4882; H01L 23/3675; H01L 23/3733; H01L 23/3736; H01L 23/473; C25D 5/02; H01B 5/14
See application file for complete search history.

(56) References Cited

U.S. PATENT DOCUMENTS 8,115,302 B2    2/2012  Andry et al.
2003/0218057 A1 11/2003 Joseph et al.
(Continued)

FOREIGN PATENT DOCUMENTS

JP    2016179491 A1   10/2016

OTHER PUBLICATIONS

Dusseault et al., Inverse opals for fluid delivery in electronics cooling systems,(https://ieeexplore.ieee.org/document/6892356), Sep. 8, 2014.

*Primary Examiner* — Patricia D Valenzuela
(74) *Attorney, Agent, or Firm* — Dinsmore & Shohl LLP

(57) ABSTRACT

A method for forming an assembly is provided. The method includes depositing a colloidal template onto a substrate, wherein the colloidal template is porous, depositing a metal layer onto and within the colloidal template, depositing a cap structure onto the colloidal template opposite of the substrate, and removing the colloidal template from between the substrate and the cap structure to form a metal inverse opal structure disposed therebetween. The method continues by depositing an electrical isolation layer in contact with the cap structure opposite the metal inverse opal structure, and attaching the electrical isolation layer to a cooling device.

15 Claims, 10 Drawing Sheets

(51) Int. Cl.
H01L 23/367 (2006.01)
H01B 5/14 (2006.01)
C25D 5/02 (2006.01)

(56) References Cited

U.S. PATENT DOCUMENTS

| | | | | |
|---|---|---|---|---|
| 2008/0265406 A1* | 10/2008 | Andry | ................... | H01L 23/473 |
| | | | | 257/713 |
| 2014/0011014 A1* | 1/2014 | King | ........................ | C25D 5/02 |
| | | | | 205/221 |
| 2014/0314948 A1* | 10/2014 | Braun | ..................... | H01M 4/04 |
| | | | | 427/58 |
| 2019/0078227 A1 | 3/2019 | Joshi et al. | | |
| 2019/0078847 A1 | 3/2019 | Joshi et al. | | |

* cited by examiner

Ollama Cloud API error: {"error":{"message":"Resource has been exhausted (e.g. check quota).","type":"api_error"}} rality of polymer spheres. By depositing the metal onto the colloidal template, the metal may be received in and extend through the plurality of spheres. In this instance, removing the colloidal template forms a metal inverse opal (MIO) structure secured against the substrate via a solid metal layer. With the MIO structure formed against the substrate and within the colloidal template, a cap structure formed of metal may be deposited onto the MIO structure and/or colloidal template along a surface of the bonding assembly opposite a surface of the substrate. The colloidal template may thereafter be removed from the substrate, for example, by dissolving the colloidal template, to form the bonding assembly with the MIO structure disposed between and bonded to the substrate and the cap layer. A collector electrode may then be formed on a side surface of the cap layer and at a surface opposite the MIO structure. An electrical isolation layer may then be deposited on the surface of the cap layer opposite the surface in contact with the MIO structure. The bonding assembly is coupled to a cooling device, such as a heatsink, a manifold, and the like, via the electrical isolation layer such that the cap structure and the MIO structure are coupled to the cooling device to transfer latent heat from the substrate to the cooling device.

The MIO structure may serve as an electrically conductive layer between the substrate and the cap structure such that the substrate may be in electrical communication with the cap structure through the porous MIO structure. Additionally, in some embodiments, the MIO structure may provide a thermally conductive cooling layer for the assembly such that a cooling fluid may enter the assembly and flow through the MIO structure to thereby cool the substrate and/or the cap structure. Various embodiments of the MIO structure and bonding assemblies including the MIO structure will be described in greater detail herein.

Figure 1:
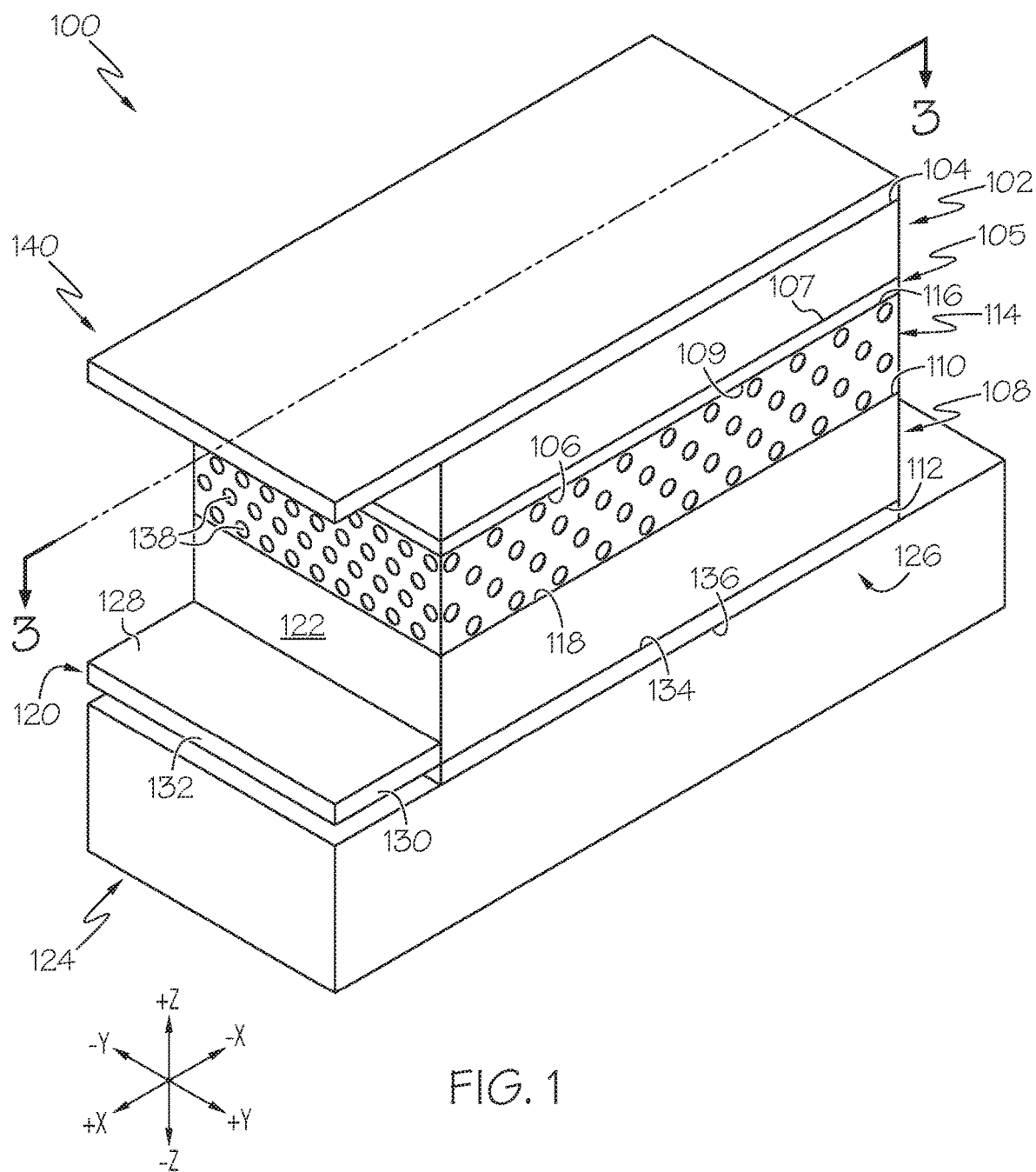

FIG. 1 depicts an example bonding assembly 100. An axial length of the bonding assembly 100 is indicated by the term "system longitudinal direction" which refers to the forward-rearward direction of the assembly (i.e., in the +/−X direction depicted in FIG. 1). The width of the bonding assembly 100 is indicated by the term "system lateral direction" which refers to the cross direction (i.e., in the +/−Y direction depicted in FIG. 1), and is transverse to the longitudinal direction. The height of the bonding assembly 100 is indicated by the term "system vertical direction" which refers to the upward-downward direction of the assembly (i.e., in the +/−Z direction depicted in FIG. 1).

Figure 2:
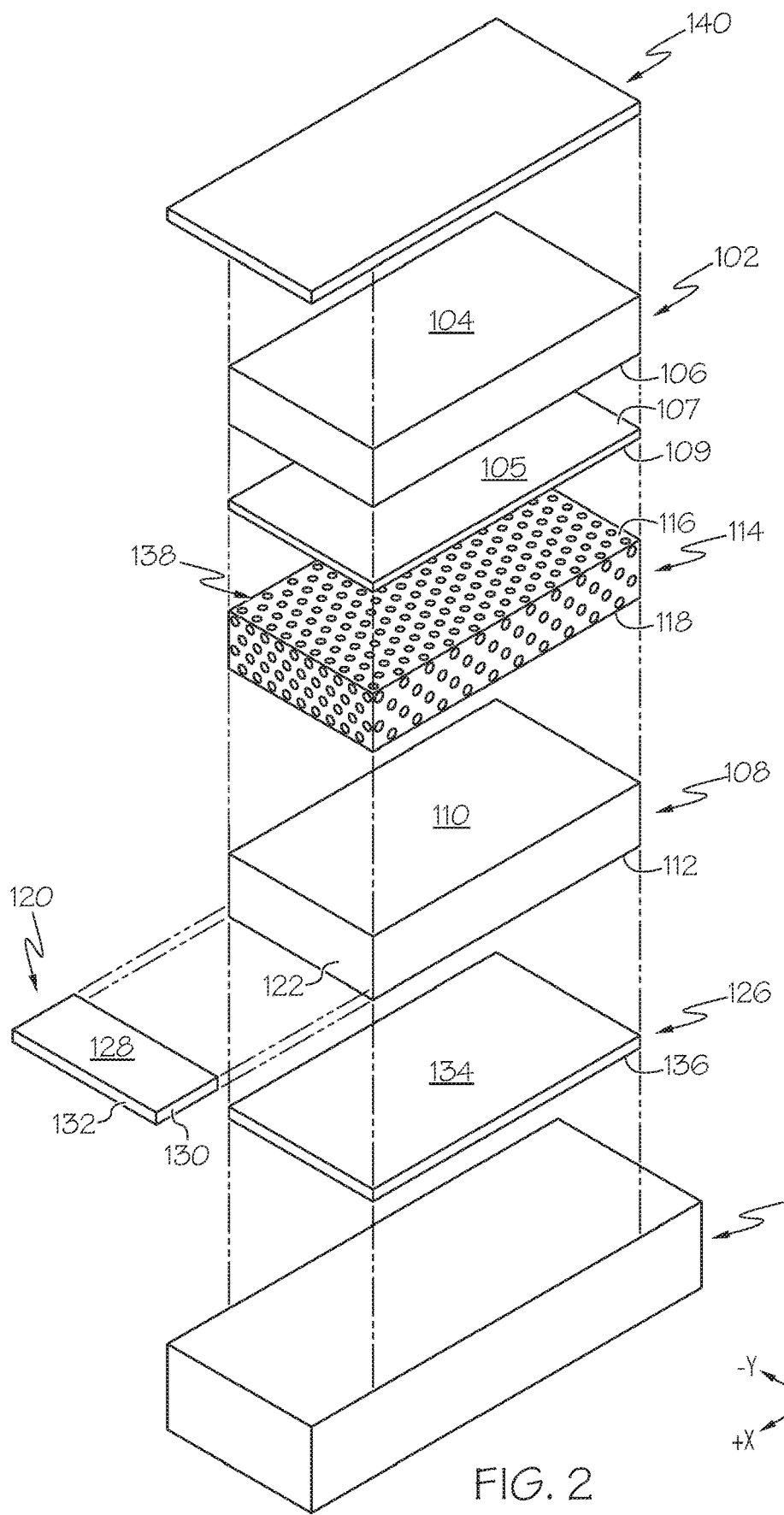
Figure 3:
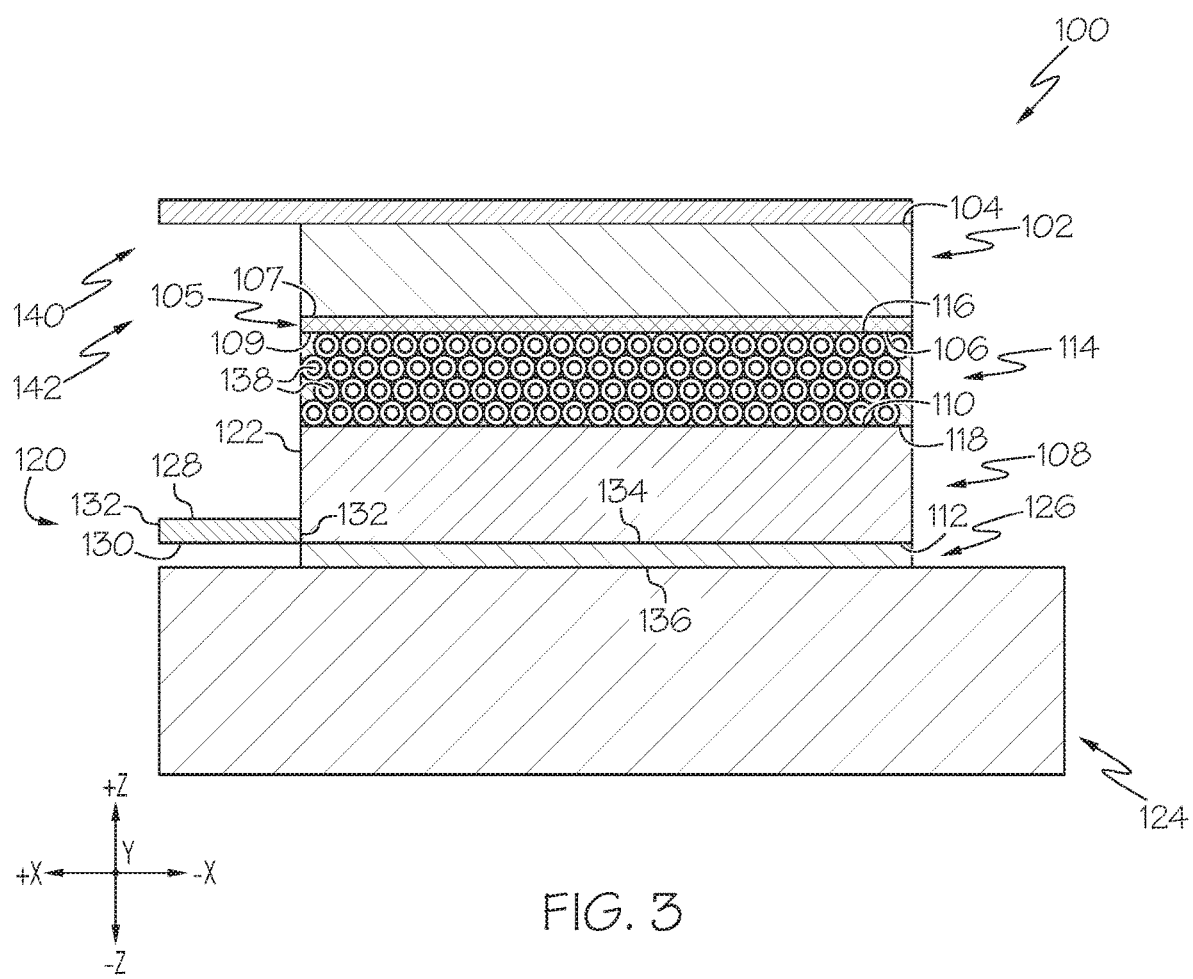

Referring initially to FIGS. 1-3, a non-limiting example of a bonding assembly 100, for example, a power electronic assembly, is illustrated. The example bonding assembly 100 generally comprises a substrate 102 with a top surface 104 and a bottom surface 106. The top surface 104 and the bottom surface 106 of the substrate 102 are generally planar. The example bonding assembly 100 further includes a cap structure 108 with an upper surface 110 and a lower surface 112. The upper surface 110 and the lower surface 112 of the cap structure are generally planar. The example bonding assembly 100 further includes a solid metal layer 105 with an upper surface 107 and a lower surface 109. The upper surface 107 and the lower surface 109 of the solid metal layer 105 are generally planar. The upper surface 107 is generally bonded to the bottom surface 106 of the substrate 102.

An MIO structure 114 with a top surface 116 and a bottom surface 118 is positioned between and bonded to the cap structure 108 and to the solid metal layer 105, which bonds the MIO structure 114 to the substrate 102. In particular, the bottom surface 106 of the substrate 102 is bonded to the upper surface 107 of the solid metal layer 105. The top surface 116 of the MIO structure 114 is bonded to the lower surface 109 of the solid metal layer 105, thereby bonding the MIO structure 114 to the substrate 102. Further, the upper surface 110 of the cap structure 108 is bonded to the MIO structure 114 along the bottom surface 118. As will be described in greater detail herein, the MIO structure 114 may be formed and bonded to the solid metal layer 105 and the cap structure 108 by depositing a metal within a colloidal template having a plurality of polymer spheres (not shown) positioned against the substrate 102 prior to depositing of the cap structure 108 onto the bonding assembly 100. It should be appreciated that the colloidal template may be formed by organic or inorganic material and that the plurality of polymer spheres may be formed of material other than polymer. The deposited metal is electroplated, at low current density (e.g., ranging from about 5 milliampere per square centimeter ($mA/cm^2$) or less), for a period of time which lifts the plurality of polymer spheres, without permitting the metal to enter the pores or voids between each of the plurality of polymer spheres. It should be appreciated that the period of time determines the thickness of the solid metal layer 105. Then the deposited metal is electroplated at a high current density (e.g., ranging from about 100 milliampere per square centimeter ($mA/cm^2$) or greater) to fill the pores or voids and create the cap structure 108. That is, electroplating the bottom surface 118 with the MIO structure 114 fully formed over the plurality of polymer spheres may further cause formation of a solid metal cap layer extending below the plurality of polymer spheres.

It should be appreciated that the MIO structure 114 and the cap structure 108 are formed from varying current densities. In particular, the solid metal layer 105 and the MIO structure 114 are formed from a low current density and the cap structure 108 is formed from a high current density such that the MIO structure 114 is a porous layer and the cap structure 108 is a solid structure. As such, by varying the current density, the metal, such as copper, is controlled as being a solid film or a porous structure.

A collector electrode 120 extends from a side surface 122 of the cap structure 108. In some embodiments, the collector electrode 120 is spot-welded on the side surface 122 of the cap structure 108. In other embodiments, the collector electrode 120 is spot-welded on the side surface 122 of the cap structure 108 after the bonding assembly 100 is attached to a cooling device 124, such as, without limitation, a heatsink, as discussed in greater detail herein. Further, in yet other embodiments, the collector electrode 120 is formed from electrodepositing a metal, such as copper, on the side surface 122 of the cap structure 108. The collector electrode 120 is generally a planar surface having an upper surface 128 and an opposite lower surface 130 defining a thickness. The collector electrode includes a pair of side surfaces 132 in which one of the pair is in contact with or attached to the side surface 122 of the cap structure 108.

An electrical isolation layer 126 is deposited on the lower surface 112 of the cap structure 108. The electrical isolation layer 126 is generally a planar surface having an upper surface 134 and an opposite lower surface 136 defining a thickness. The upper surface 134 of the electrical isolation layer 126 is coupled to the lower surface 112 of the cap structure 108. The electrical isolation layer 126 may be an oxide layer that is formed by atomic layer deposition (ALD), thermal oxidation, plasma-enhanced chemical vapor deposition (PECVD), and the like.

The bonding assembly 100 is coupled to the cooling device 124 via solder, transient liquid phase (TLP) bonding, and the like. In particular, the lower surface 136 of the electrical isolation layer 126 of the bonding assembly 100 is coupled to the cooling device 124. The electrical isolation layer 126 electrically isolates the cooling device 124 from the substrate 102. An emitter electrode 140 is attached to the top surface 104 of the substrate 102. It should be appreciated that the attachment of the emitter electrode 140 to the substrate 102 is by any method known to one skilled in the art and that the attachment may occur at any point in the illustrative methods 400, 600, and/or 1000, as described herein.

The substrate 102 may be any component. In some embodiments, the substrate 102 may comprise a semiconductor device and may be formed from a wide band gap semiconductor material suitable for the manufacture or production of power semiconductor devices such as power insulated-gate bi-polar transistors (IGBTs), power metal-oxide field-effect transistors (MOSFETs), power transistors, and the like. In some embodiments, the substrate 102 may be formed from wide band gap semiconductor materials. Non-limiting examples of such wide band gap semiconductor materials include silicon carbide (SiC), aluminum nitride (AlN), gallium nitride (GaN), gallium oxide (Ga2O3), boron nitride (BN), diamond, and/or the like. In other embodiments, the substrate 102 is generally an insulating component in which the bottom surface 106 includes a conductive layer.

The cap structure 108 serves as a bottom substrate for the bonding assembly 100 and may be formed of any type of substrate for power semiconductor device assemblies known to those skilled in the art. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. In embodiments, the cap structure 108 may be plated with a metal along an exterior surface, such as, for example, aluminum (Al), nickel (N), and the like. As will be described in greater detail herein, the cap structure 108 may be formed from a thermally conductive material such that heat from the substrate 102 is transferred to the MIO structure 114 interlaid between the substrate 102 and the cap structure 108.

The thickness of the substrate 102 and the cap structure 108 may depend on the intended use of the bonding assembly 100. In non-limiting examples, the substrate 102 has a thickness within the range of about 0.1 millimeters to about 0.3 millimeters, and the cap structure 108 has a thickness within the range of about 1.0 millimeter to about 2.0 millimeters (including endpoints). In this instance, the bonding assembly 100 may have a maximum height within the range of about 1.1 millimeters to about 2.3 millimeters. It should be understood that other thicknesses of the substrate 102 and/or the cap structure 108 may be utilized in bonding assembly 100.

The MIO structure 114 may be any inverse opal structure, such as, for example, a metal inverse opal structure (e.g., a copper inverse opal (CIO) structure, a nickel inverse opal (NIO) structure, or the like) or the like. The MIO structure 114 has a plurality of pores and/or voids 138 that define a porosity of the MIO structure 114. The plurality of pores and/or voids 138 provides a thermal conductivity for the MIO structure 114 between the substrate 102 and the cap structure 108. For example, the plurality of pores and/or voids 138 permit heat introduced into the bonding assembly 100 to flow through each of the plurality of pores and/or voids 138 throughout the MIO structure 114 and contact a greater amount of surface area for the purposes of heat transfer. It should be appreciated, as discussed herein, the plurality of pores and/or voids 138 are formed by a low current density.

It should be understood that inverse opal structures (including MIO structures) have a high permeability as inverse opal wick structures provide the advantage of improved control over pore sizes and distribution. Accordingly, the thermal conductivity of the MIO structure 114 can be varied and controlled to accommodate thermomechanical stresses generated within the bonding assembly 100. In some embodiments, the MIO structure 114 is further configured to provide heat flux thermal management within the bonding assembly 100 such that the MIO structure 114 may improve heat exchange between the substrate 102 and the cap structure 108 at a high heat removal rate. As will be described in greater detail below, it should be understood that, in other embodiments, the bonding assembly 100 may include other arrangements and configurations than that shown and described above. While the plurality of pores and/or voids 138 of the present example are specifically shown and described herein as defining a series of dimples and/or pores throughout the MIO structure 114, other surface features contained within the MIO structure 114 may also be included without departing from the scope of the present disclosure.

The number of the plurality of pores and/or voids 138 and/or other surface features present in the MIO structure 114 is not limited by the present disclosure, and may be any number so long as the connectivity between the material of the MIO structure 114 the cap structure 108 and the bottom surface 106 of the substrate 102 via the solid metal layer 105 is maintained. Thus, latent heat, thermally conducted by the cooling device 124, flows through the plurality of pores and/or voids 138 and/or other surface features of the MIO structure 114, is transferred through the cap structure 108 to draw heat away from the one or more heat generating devices (i.e., the substrate 102). While the plurality of pores and/or voids 138 appears generally spherical in shape, this is merely illustrative. Accordingly, it should be understood that the plurality of pores and/or voids 138 may be any shape (including irregular shapes). The shape of the plurality of pores and/or voids 138 may be determined from the shape of the materials used to form the MIO structure 114. Further, the thickness of the MIO structure 114 is not limited by the present disclosure, and may generally be any thickness.

As briefly described above, the MIO structure 114 may generally be constructed of a thermally conductive material, but is otherwise not limited by the present disclosure. In some embodiments, the material used for the MIO structure 114 may be selected based on the process used to form the MIO structure 114, as described in greater detail herein. For example, if the MIO structure 114 is formed from an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

Referring now to FIGS. 1-4, an example method 400 for forming the bonding assembly 100 generally described above will be described. It should be understood that method 400 is merely illustrative and that the bonding assembly 100 may be formed in various other methods. Initially, at step 402, a colloidal template is deposited on a substrate. In particular, the colloidal template includes a top surface and a bottom surface, such that the top surface is deposited against the bottom surface of the substrate. In this instance, the substrate and the colloidal template are bonded together by an intermediary bonding layer disposed therebetween.

In some embodiments, the colloidal template is a polystyrene structure formed of a plurality of polymer spheres extending between the top surface and the bottom surface. The structure of the colloidal template may be formed of a plurality of polystyrene spheres forming a plurality of pores and/or voids disposed between the plurality of polymer spheres. The plurality of polymer spheres are sized and shaped to form an interconnected network of pores and/or voids throughout the colloidal template. The plurality of polymer spheres is configured to receive a metal therethrough. At step 404, the metal may be electrodeposited onto the colloidal template at low current density (e.g., ranging from about 50 milliampere per square centimeter ($mA/cm^2$) or less), for a period of time, which causes the plurality of polymer spheres to lift (i.e., in the +/−Z direction) from the bottom surface of the substrate and form a solid metal layer therebetween. The length of the period of time may determine the thickness of the solid metal layer.

That is, the deposited metal may be electroplated, at low current density for a period of time which causes the plurality of polymer spheres of the colloidal template to lift and form a solid metal layer between the plurality of polymer spheres and the substrate with a thickness that may be based on the length of a period of time of the electroplating. In this instance, the metal is received in and transferred through the polystyrene structure of the colloidal template, but does not enter the voids or pores between the plurality of polymer spheres. The metal may be formed from any electrically conductive material, such as, for example, copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy.

With the metal received within the plurality of pores of the colloidal template, metal inverse opals are effectively grown on the solid metal layer, at step 406, and in particular, along the bottom surface of the solid metal layer where the colloidal template engages the substrate. It should be appreciated that the metal inverse opals are grown from varying current densities. In particular, as discussed above, electroplating at a low current density causes the metal received within the plurality of polymer spheres of the colloidal template to lift or float in a direction away from the bottom surface of the substrate in the system vertical direction (i.e., in the +/−Z direction) and form the solid metal layer. The low current density lifts the plurality of spheres, but does not enter the pores or voids between the polymer spheres, which forms the MIO structure. As such, the MIO structure is a porous layer in contact with the solid layer, which in turn is in contact with the substrate. It should be appreciated that by varying the current density, the metal, such as copper, is controlled to be a porous structure and the number of pores and/or voids, diameter of each of the pores and/or voids, the number of layers, the thickness of the MIO structure, and the like may also be controlled.

At step 408, the cap structure may be provided, and in particular, electroplating the metal to form the cap structure onto the colloidal template. For instance, electroplating at high current density (e.g., ranging from about 100 milliampere per square centimeter ($mA/cm^2$) or greater) is used to fill the voids or pores and form the cap structure. That is, electroplating the bottom surface with the MIO bonding structure fully formed over the plurality of polymer spheres may further cause formation of the cap structure extending below the plurality of polymer spheres. As such, the top surface of the cap structure may be electroplated onto the bottom surface of the colloidal template thereby bonding the cap structure to the colloidal template along a surface opposite of the substrate. That is, the cap structure is formed by electrodepositing the metal beyond a tallest level of the colloidal template in the system vertical direction (i.e., in the +/−Z direction) on the surface of the colloidal template opposite the surface in contact with the substrate. As such, the colloidal template is positioned between the cap structure and the substrate. It should be appreciated that the cap structure may be a solid structure or a solid film. In some embodiments, the cap structure may be bonded to the colloidal template via thermal bonding, transient liquid phase (TLP) bonding, electrolytic or electroless bonding, and/or the like. It should be appreciated that by varying the high current density, the metal, such as copper, that forms the cap structure is controlled to be a solid structure (instead of a porous structure) so to set the thickness of the cap structure, where the cap structure begins with respect to the plurality of pores and/or voids of the MIO structure, and the like.

With the cap structure securely fixed to the bonding assembly, the colloidal template may be removed, at step 410. As such, removing the colloidal template from between the substrate and the cap structure forms the MIO structure within the bonding assembly between the cap structure and the substrate. It should be understood that the colloidal template may be removed from the bonding assembly via various methods, including but not limited to, dissolving the colloidal template with a solution to thereby uncover the MIO structure formed within the porous structure of the colloidal template. In this instance, the MIO structure is disposed between and bonded to the substrate and the cap structure, and in particular, the top surface of the MIO structure is bonded to the bottom surface of the substrate and the bottom surface of the MIO structure is bonded to the top surface of the cap structure.

In other embodiments, it should be understood that the colloidal template may be removed from the bonding assembly prior to the attachment of the cap structure such that the cap structure is bonded directly to the MIO structure. It should be understood that in other embodiments, the colloidal template may be initially positioned against the cap structure, rather than the substrate, as described above, such that the bottom surface of the colloidal template is positioned against the top surface of the cap structure. In this instance, the metal received within the plurality of polymer spheres of the colloidal template effectively provides metal inverse opals on the cap structure prior to the substrate being deposited onto the colloidal template. The bottom surface of the substrate may be electroplated onto the top surface of the colloidal template, thereby bonding the substrate to the colloidal template along a surface opposite of the cap structure. As described above, the substrate may be bonded to the colloidal template via thermal bonding, transient liquid phase (TLP) bonding, electrolytic or electroless bonding, and/or the like.

The MIO structure includes a plurality of pores and/or voids that are interconnected defining a skeletal network of metal formed by the plurality of polymer spheres of the colloidal template. The MIO structure, formed of the metal, serves as an electrically conductive layer positioned between the substrate and the cap structure. Accordingly, it should be understood that the MIO structure may provide an electrically conductive path between the substrate and the cap structure. The MIO structure has a predetermined thermal conductivity that may compensate for thermally induced stresses between the substrate and the cap structure generated during use of the bonding assembly and/or bonding of the cap structure to the substrate.

The skeletal network of metal of the MIO structure has a large surface area and the amount of porosity of the MIO structure can be varied during fabrication by changing the size of the plurality of polymer spheres of the colloidal template. Further, the size of the plurality of pores and/or voids of the MIO structure may be varied as a function of the thickness of the MIO structure such that a graded porosity, i.e. graded hollow pore diameter, is provided as a function of thickness. The size (diameter) of the plurality of pores and/or voids may vary. It should be appreciated that the size of the plurality of pores and/or voids may be controlled based on the amount of intensity of the low current density used to form the plurality of pores and/or voids. In a non-limiting example, the diameter of the plurality of pores and/or voids is approximately 500 micrometers. It should be understood that the maximum height of the bonding assembly is dependent on, in addition to a thickness of the substrate and the cap structure, and the size (diameter) of the plurality of pores and/or voids of the MIO structure.

The MIO structure may further provide cooling of the substrate during operation of the bonding assembly. In particular, as noted above, the MIO structure includes the plurality of pores and/or voids disposed between the top surface and the bottom surface such that the MIO structure has an open porous structure through which latent heat, thermally conducted by the cooling device, can flow through, thereby effectively removing heat from the substrate. It should be understood that the bonding assembly may include various heat passages and configurations through the MIO structure to effective transfer latent heat to the cooling device. Accordingly, the MIO structure may provide various benefits and functionalities for the bonding assembly, including but not limited to, a thermal stress compensation layer between the substrate and the cap structure, an electrically conductive path between a first electrode and a second electrode disposed on opposite surfaces of the bonding assembly, and a thermally conductive cooling layer for the substrate.

It should be appreciated that in some embodiments, a side portion(s) of the MIO structure may be etched to remove any overhang portion(s) of the MIO structure that exceed a length of the bottom surface of the substrate. It should be understood that the removal of any overhangs is merely optional such that, in some embodiments, the bonding assembly may include the MIO structure having the side portions extending beyond the bottom surface of the substrate thereby forming the overhang portion(s) while in other embodiments, the overhangs are removed.

At step 412, a collector electrode is deposited on the cap structure, and in particular, on the side surface of the cap structure. For instance, one of the pair of side surfaces of the collector electrode may be electrodeposited onto the side surface of the cap structure thereby bonding the collector electrode on the cap structure. As such, the collector electrode extends in a system lateral direction with respect to the side surface of the cap structure. In some embodiments, the collector electrode may be bonded on the cap structure via thermal bonding, transient liquid phase (TLP) bonding, electrolytic or electroless bonding, and/or the like. In other embodiments, the collector electrode is preformed and is spot-welded on the side surface of the cap structure. The collector electrode is spot-welded on the cap structure via resistance spot welding, projection welding, laser spot welding, laser seam welding, and the like.

At step 414, an electrical isolation layer is deposited on the cap structure, and in particular, along the bottom surface of the cap structure. In some embodiments, the electrical isolation layer may be an oxide layer that is formed by atomic layer deposition (ALD), thermal oxidation, plasma-enhanced chemical vapor deposition (PECVD), and the like. As such, in embodiments, the electrical isolation layer may a thin film. For instance, the electrical isolation layer may be a grown film such as SiO2 from by oxidation of the Si substrate or a deposited film such as crystalline, poly crystalline, amorphous and the like.

At step 416, the bonding assembly is coupled to the cooling device and in particular, along the bottom surface of the electrical isolation layer. In some embodiments, the electrical isolation layer may be coupled to the cooling device via solder, transient liquid phase (TLP) bonding, and the like. It should be appreciated that the electrical isolation layer electrically isolates the cooling device from the substrate. That is, the electrical isolation layer electrically separates the cap structure including the collector electrode, the MIO assembly, (i.e. the bonding assembly) and the substrate from the cooling device. As such, the electrical isolation layer is geometrically the same shape and size of the cap structure to isolate the bonding assembly from the cooling device. Further, it should be appreciated that the collector electrode is spaced apart from the cooling device in the system vertical direction. In some embodiments, the cooling device extends in the system lateral direction and/or in the system longitudinal direction equal to and/or uniform with the distance the collector electrode extends in the system lateral direction. In other embodiments, the cooling device extends in the system lateral direction and/or in the system longitudinal direction an unequal or non-uniform distance that the collector electrode extends in the system lateral direction and/or the system longitudinal direction.

At step 418, an emitter electrode is deposited onto the substrate. In particular, the emitter electrode is deposited onto the top surface of the substrate. It should be appreciated that the attachment of the emitter electrode 140 to the substrate 102 is by any method known to one skilled in the art and that the attachment electrically connects the emitter electrode to the bonding assembly. In some embodiments, the emitter electrode extends beyond the side surface of the cap structure in the system lateral direction and is spaced apart from the collector electrode in the system vertical direction to define a gap 142. In some embodiments, the emitter electrode extends in the system lateral direction and/or in the system longitudinal direction equal to and/or uniform with the distance the collector electrode and the cooling device extends in the system lateral direction and/or in the system longitudinal direction. In other embodiments, the emitter electrode, the cooling device, and/or the collector electrode extend in the system lateral direction and/or in the system longitudinal direction in unequal or non-uniform distances.

It should be understood that, in other embodiments, the bonding assembly may include other arrangements and configurations than that shown and described above. In other embodiments, a bonding assembly may include a second MIO structure formed along the lower surface 112 of the cap structure 108, opposite of the MIO structure 114 formed along the upper surface 110 of the cap structure 108. It should be understood that the second MIO structure may be formed along the lower surface 112 of the cap structure 108 in a substantially similar manner as described herein with respect to MIO structure 114. A second substrate may be disposed over the second MIO structure such that two substrates are bonded to the cap structure 108 with the cap structure 108 disposed between the two substrates (i.e., power semiconductor devices). Accordingly, each substrate is bonded to the cap structure 108 by a separate MIO structure. In other embodiments, there can be multiple substrates and/or bonding assemblies coupled via solder, TLP bonding, and the like. As such, it should be appreciated that the cap structure permits multiple substrates and/or bonding assemblies to be coupled together in series due to the solid properties of the cap structure.

Figure 5:
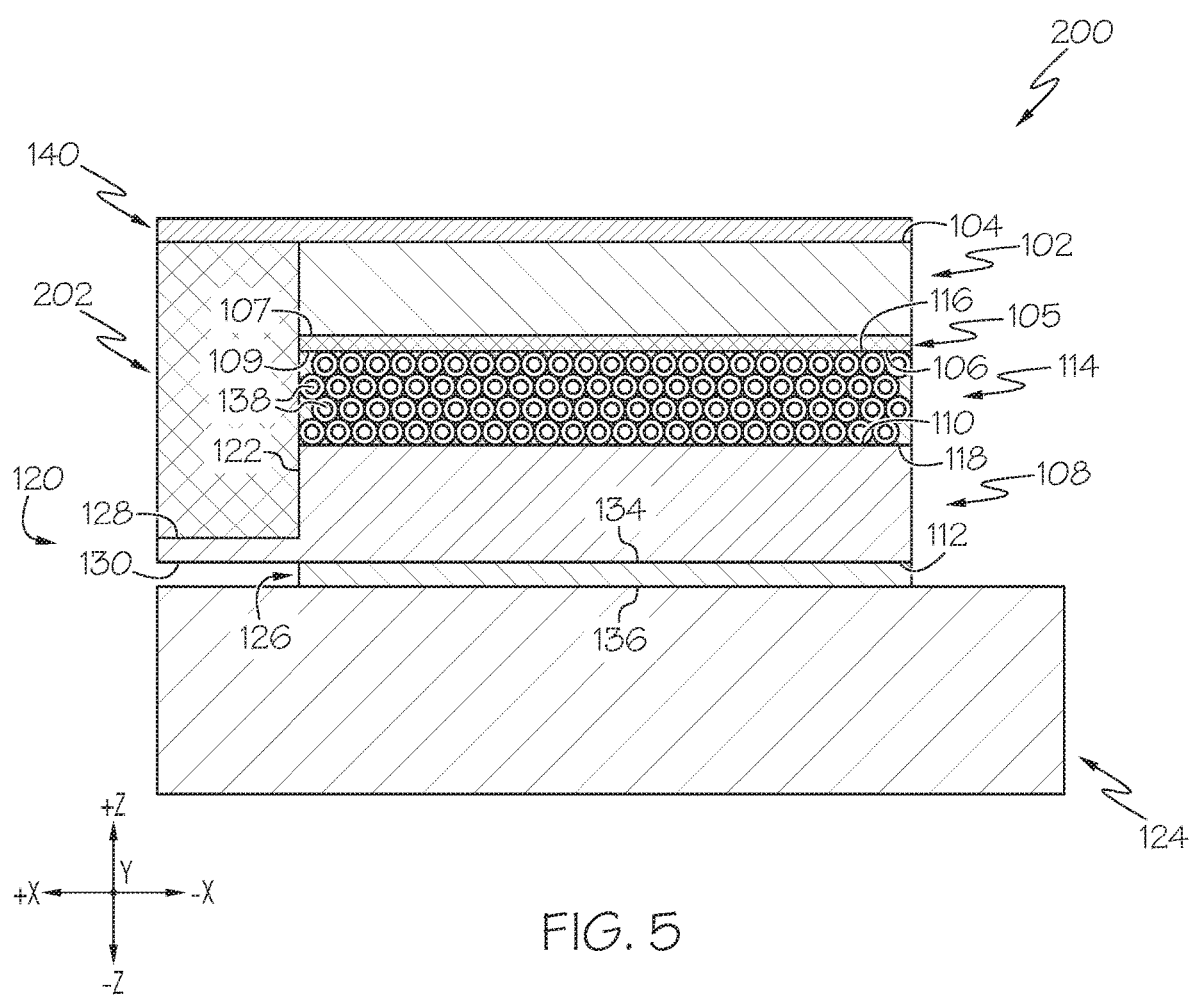

Referring now to FIG. 5, a second embodiment of an example bonding assembly 200 is illustrated. Except for the differences explicitly noted herein, it should be understood that the bonding assembly 200 is similar to the example bonding assembly 100 described above such that the bonding assembly 200 may be configured and operable just like the bonding assembly 100. Accordingly, identical components are marked with the same reference numerals. It should be understood that any components and operabilities of the bonding assembly 200 that are not explicitly described below may be the same as the components and operabilities of the bonding assembly 100 described above.

The bonding assembly 200 further includes a mask 202 deposited in the gap 142 defined by the vertical distance between the emitter electrode 140 and the collector electrode 120. The mask 202 is deposited such that the collector electrode 120 may be formed. That is, the mask 202 make be patterned to allow or prohibit material to pass through and thus is patterned to set the desired position for the collector electrode 120 to be formed of the metal used to form the cap structure 108. That is, during the depositing of the cap structure 108, additional metal, such as copper, is electro-deposited such that an overhang is formed, extending through the pattern of the mask 202, defining the collector electrode 120. The mask 202 is a device that has a plurality of predetermined patterns configured to shape desired geometries within the bonding assembly 200. As such, the mask 202 permits the additional electro-deposited metal to form the overhang which creates the collector electrode 120 in a predetermined geometric shape and in a predetermined location in the bonding assembly 200.

It should be appreciated that, in some embodiments, the mask 202 may be a solid layer with a pattern that blocks or precludes material, such as metal from passing through and/or occupying the same area as the mask 202. In other embodiments, the mask 202 is patterned to include a plurality of apertures, voids, cavities, and the like such that material, such as metal, may pass through or form a plurality of predetermined geometric shapes, such as the collector electrode 120, described herein. The mask 202 may be a photomask, a mechanical mask, a chromes mask, an etch mask, and the like.

Figure 6:
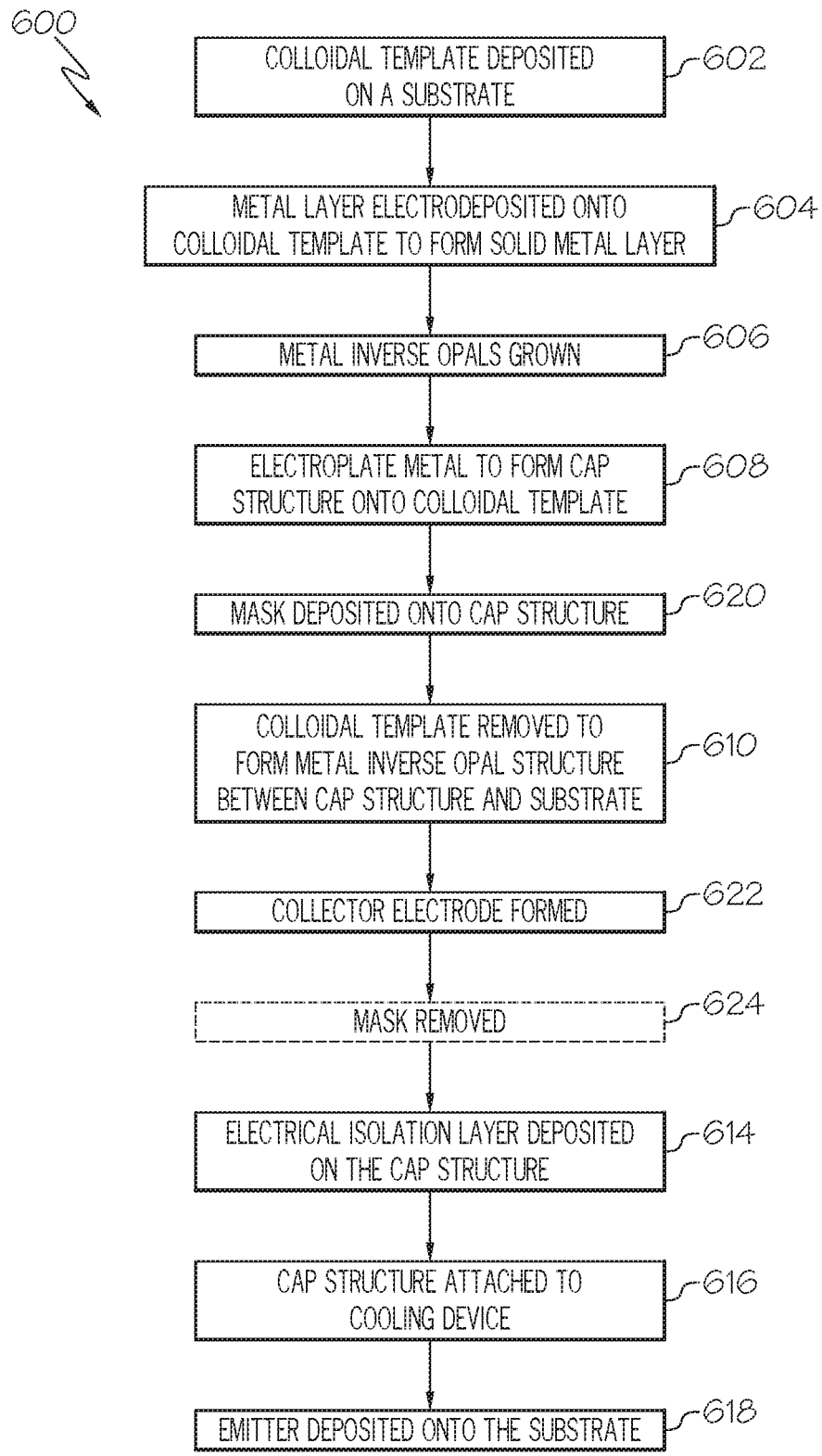

Referring now to FIGS. 5-6, an example method 600 for forming the bonding assembly 200 generally described above will be described. It should be understood that method 600 is merely illustrative and that the bonding assembly 200 may be formed in various other methods. Further, it should be understood that like steps in the method 600 to the method 400 are increased in number by 200 and that these like steps are not discussed in detail again for brevity reasons.

Figure 4:
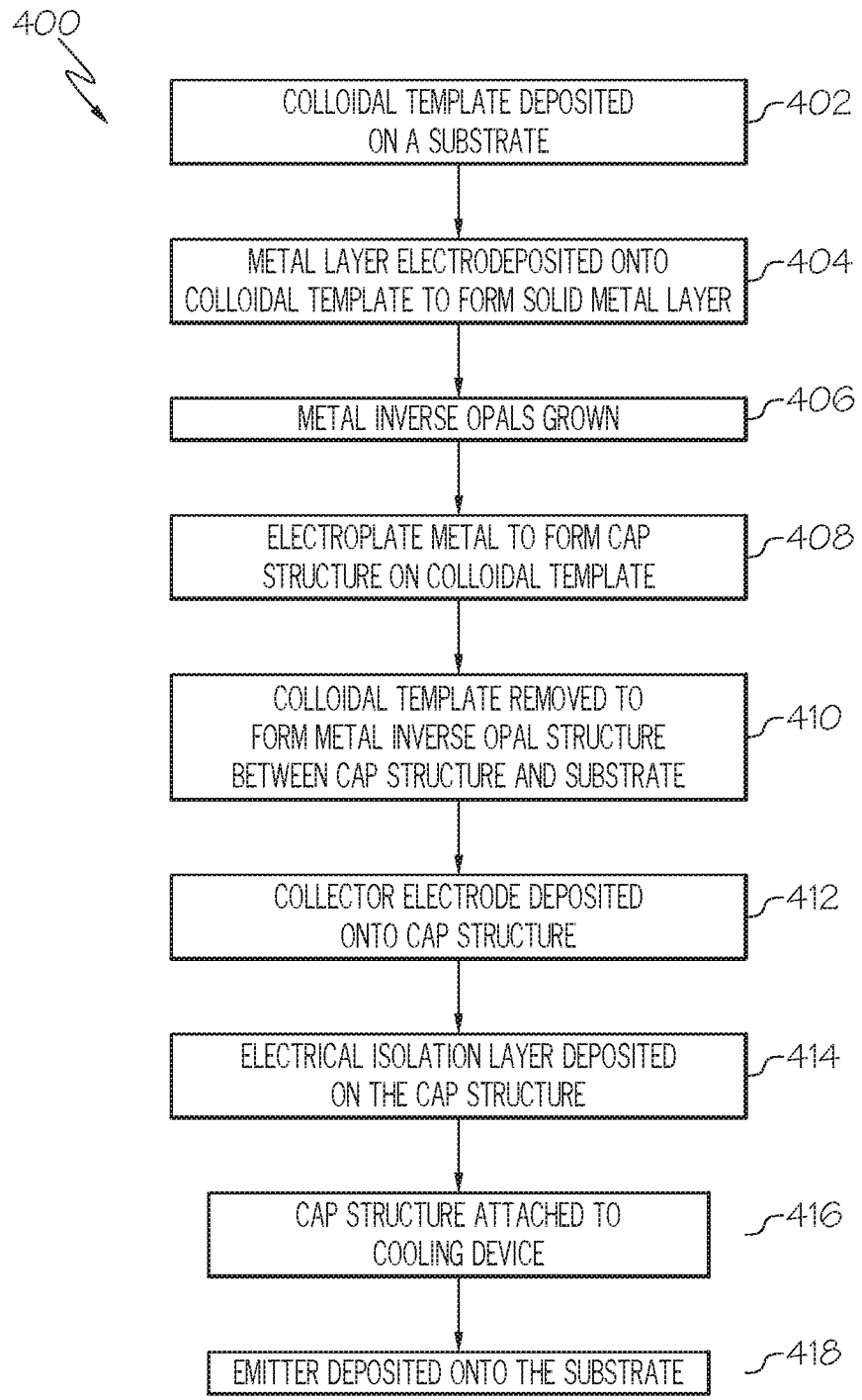

It should be appreciated that steps 602-608 of the example method 600 are identical to the steps 402-408 of the example method 400 (FIG. 4) and are not repeated here. Following the electroplating of the metal to form the cap structure onto the colloidal template, at step 608, a mask is deposited onto the cap structure, at step 620. In particular, the mask is deposited to the side surface of the cap structure. The mask is configured with a pattern that shapes material deposited within the bonding assembly into desired geometries. As such, in this embodiment, the mask deposited onto the cap structure includes pattern that permits material, such as metal, to pass through the mask device at a predetermined location and at a predetermined length in the system lateral direction. With the mask securely fixed to the cap structure, the colloidal template may be removed, at step 610. Removing the colloidal template from between the substrate and the cap structure forms the MIO structure within the bonding assembly between the cap structure and the substrate, as described in greater detail above with respect to step 410 (FIG. 4).

With the colloidal template removed, the collector electrode is formed, at step 622. The collector electrode is formed from the corresponding pattern in the mask permitting additional metal used during the depositing of the cap structure to form an overhang. The overhang defines the collector electrode. It should be appreciated that, in this embodiment, the cap structure and the collector electrode are the same material or that the collector electrode is integrally formed from the cap structure. That is, the collector electrode may be formed, similar to the cap structure, from a high current density such that the collector electrode is a solid structure or a solid film. It should be appreciated that by varying the high current density, the metal, such as copper, that forms the collector electrode is controlled to be a solid structure (instead of a porous structure) and is controlled to set the thickness of the collector electrode.

The collector electrode extends from the side surface of the cap structure in the system longitudinal direction (i.e., in the +/−X direction). In some embodiments, the thickness of the collector electrode is determined by the type of bonding assembly, the type of substrate, and the like and is predetermined by the pattern in the mask. Further, the mask may set the length of the collector electrode in the system lateral direction and the width of the collector electrode in the system longitudinal direction.

With the collector electrode formed, the mask may now be removed at step 624. It should be appreciated that in some embodiments, the mask will remain in position in the bonding assembly 200 to provide support to the emitter electrode and to the collector electrode. In other embodiments, the mask is removed to define the bonding assembly 100 (FIGS. 1-3). As such, the removal of the mask is optional, as defined by the dotted lines at step 624. Regardless of whether the mask is removed from or remains in the bonding assembly 200, the electrical isolation layer is deposited to the cap structure, at step 614, the cap structure is attached to the cooling device, at step 616, and the emitter is deposited onto the substrate, at step 618, in the exact manner as described with reference to steps 414, 416, and 418 (FIG. 4) above.

Figure 7:
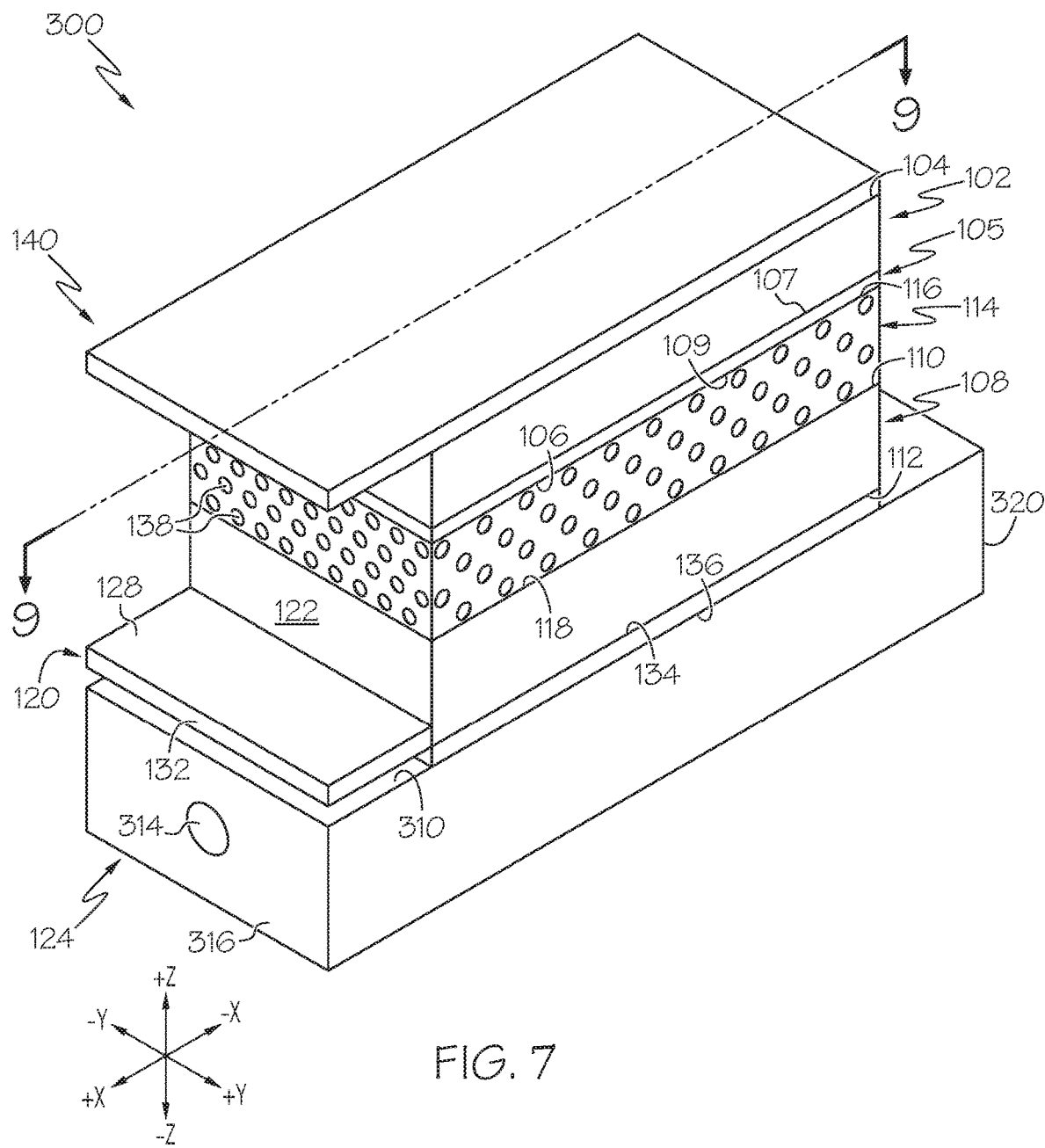
Figure 8:
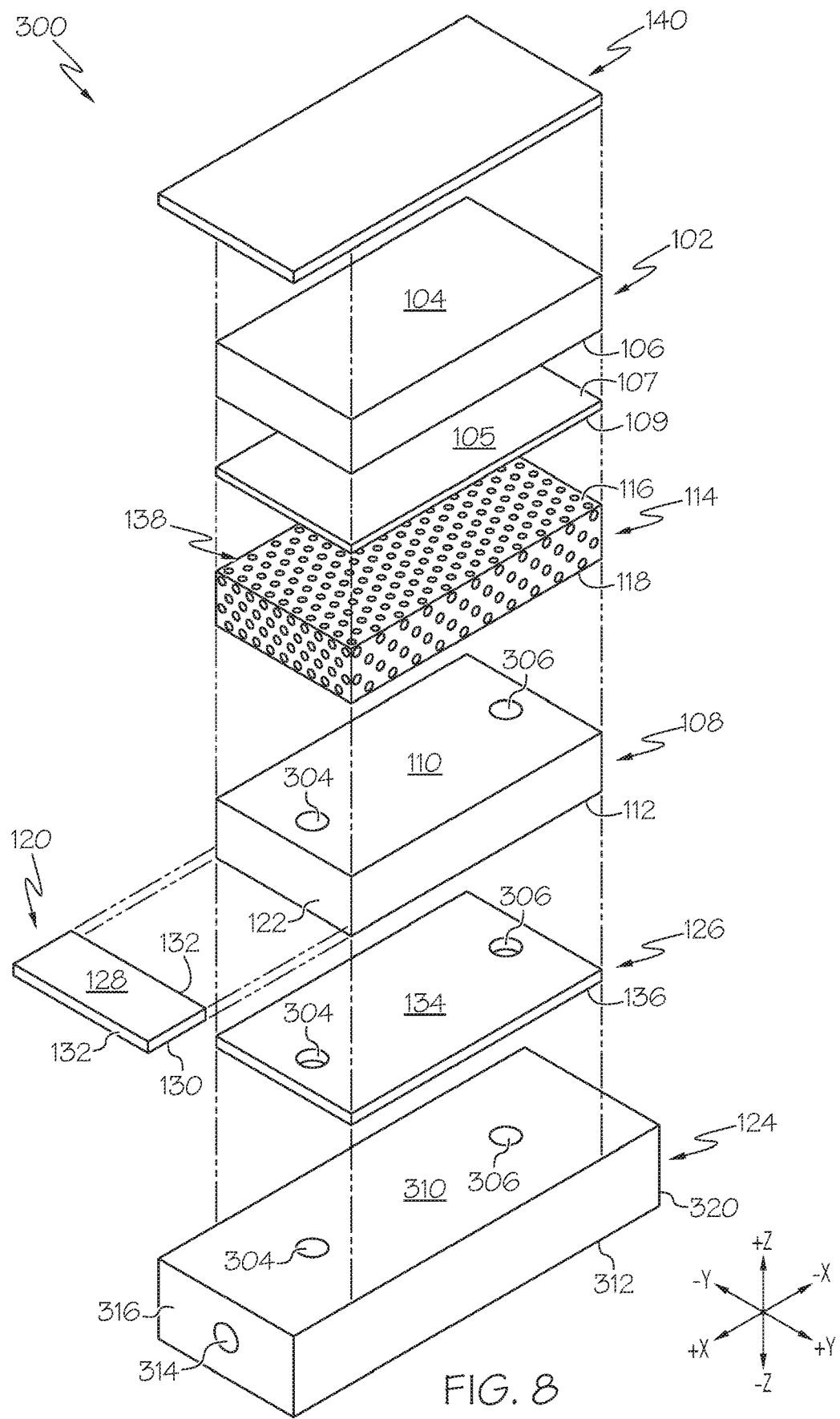
Figure 9:
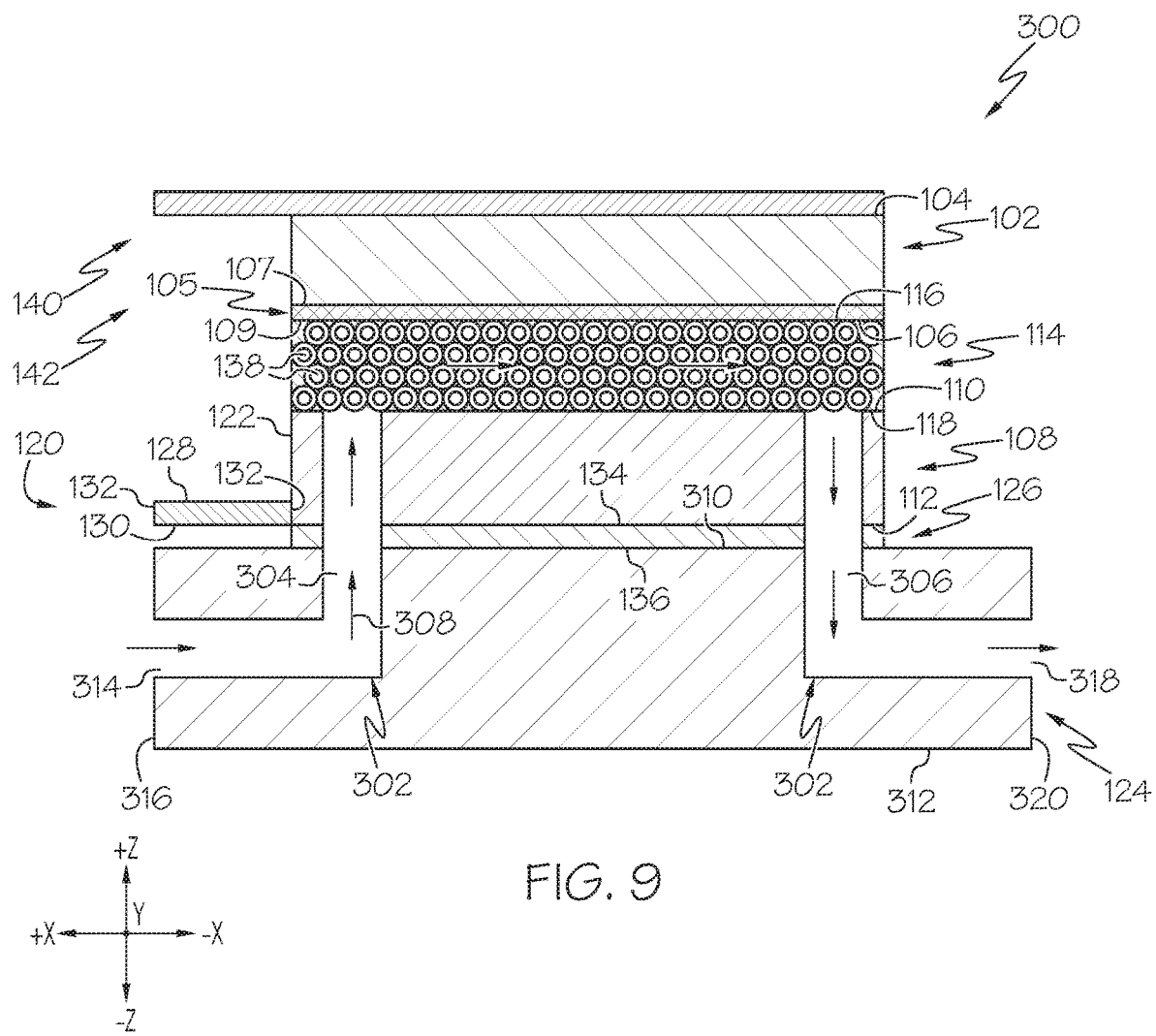

Referring now to FIGS. 7-9, a third embodiment of an example bonding assembly 300 is illustrated. Except for the differences explicitly noted herein, it should be understood that the bonding assembly 300 is similar to the example bonding assembly 100 described above such that the bonding assembly 300 may be configured and operable just like the bonding assembly 100. Accordingly, identical components are marked with the same reference numerals. It should be understood that any components and operabilities of the bonding assembly 300 that are not explicitly described below may be the same as the components and operabilities of the bonding assembly 100 described above.

As seen best in FIGS. 8-9, the bonding assembly 300 includes an integrated fluid channel system 302 extending through the cap structure 108, the electrical isolation layer 126, and a portion of the cooling device 124, as discussed in greater detail herein. The integrated fluid channel system 302 includes an inlet fluid channel 304 and an outlet fluid channel 306 that together define a fluid path within the integrated fluid channel system 302. Further, as discussed above, the MIO structure 114 includes a plurality of pores and/or voids 138 disposed between the top surface 116 and the bottom surface 118 such that the MIO structure 114 has an open porous structure through which fluid can flow through. That is, the plurality of pores and/or voids 138 of the MIO structure 114 may extend therethough. The plurality of pores and/or voids are three dimensionally connected at contact points such that a cooling fluid 308 introduced into the bonding assembly 100 can flow through. For example, the cooling fluid 308 flows from the inlet fluid channel 304, through each of the plurality of pores and/or voids 138 throughout the MIO structure 114, and flows through the outlet fluid channel 306 for the purposes of heat transfer. As such, the MIO structure 114 may be part of the integrated fluid channel system 302.

It should be appreciated that inner surfaces of the plurality of pores and/or voids 138 may be coated with an electrically isolating material. The isolating material may generally be any material that is electrically non-conductive (e.g., an electrical insulator). The electrical isolation prevents the MIO structure 114 from being electrically coupled to the cooling fluid 308 flowing therethrough. Illustrative examples of isolating materials include, but are not limited to aluminum oxide, alumina, silicon dioxide ($SiO_2$), and/or the like. Several methods for coating the inner surfaces of the plurality pores and/or voids 138 are known. For instance, coating by ALD, thermal oxidation, PECVD, and the like may be used.

It should be appreciated that the number of the plurality of pores and/or voids 138 and/or other surface features present in the MIO structure 114 is not limited by the present disclosure, and may be any number so long as the connectivity between the material of the MIO structure 114, the cap structure 108 and the substrate 102 via the solid metal layer 105 is maintained. Further, while the plurality of pores and/or voids 138 appears generally spherical in shape, this is merely illustrative. Accordingly, it should be understood that the plurality of pores and/or voids 138 may be any shape (including irregular shapes). The shape of the plurality of pores and/or voids 138 may be determined from the shape of the materials used to form the MIO structure 114, the low current density, and the like, as discussed with reference to FIGS. 1-3. Further, the thickness of the MIO structure 114 is not limited by the present disclosure, and may generally be any thickness.

The cooling device 124 of the third example bonding assembly 300 may be a manifold. The manifold is an electrical insulator. For example, the manifold material may include a polymer, a polyether ether ketone, and/or the like such that the manifold has insulating properties. The cooling device 124 includes an upper surface 310 offset by a thickness opposite a lower surface 312, and the inlet and outlet fluid channels 304, 306 disposed within. The cooling device 124 further includes a fluid inlet opening 314 disposed in one side surface 316 and a fluid outlet opening 318 is disposed in the opposite side surface 320. The fluid inlet opening 314 is in fluid communication with the inlet fluid channel 304 and the fluid outlet opening 318 is in fluid communication with the outlet fluid channel 306.

In operation, the cooling fluid 308 flows through the plurality of pores and/or voids 138 and/or other surface features of the MIO structure 114 (i.e., passages, cavities, and the like), such that latent heat carried from the cooling fluid 308 is transferred through the MIO structure 114, through the outlet fluid channel 306, and to other portions of the bonding assembly 300 to draw heat away from the one or more heat generating devices (i.e., the substrate 102). In some embodiments, heat can be transferred to the cooling fluid 308 from the MIO structure 114 such that the cooling fluid 308 carries the heat away from the substrate 102.

The integrated fluid channel system 302 that provides the cooling fluid 308 from the fluid inlet opening 314 to the fluid outlet opening 318 may be connected to a fluid pump (not shown) such that the cooling fluid 308 may be pumped through the fluid inlet opening 314 and out of the fluid outlet opening 318 as described above. In operation, the cooling fluid 308 flowing through the integrated fluid channel system 302 may remove heat from one or more heat generating devices. A cooling fluid reservoir (not shown) may be fluidly connected to the fluid pump, the fluid inlet opening 314 and/or the fluid outlet opening 318 such that the cooling fluid reservoir may house the cooling fluid 308, and the fluid pump may pump the cooling fluid 308 through the integrated fluid channel system 302. For example, the cooling fluid 308 may be pumped from the cooling fluid reservoir into the fluid inlet opening 314, through the integrated fluid channel system 302, through the MIO structure 114 and out of the fluid outlet opening 318 back into the cooling fluid reservoir. Further, a secondary heat exchanger (not shown) may remove heat collected by the cooling fluid 308 before the cooling fluid enters the cooling fluid reservoir.

Non-limiting cooling fluids include dielectric cooling fluids such as R-245fa and HFE-7100. Other dielectric cooling fluids may be utilized. Further, other electrically conductive cooling fluids such as water may be used since the inner surfaces of the plurality of pores and/or voids 138 that define the fluid path is coated with an isolating material. It should be appreciated that the type of cooling fluid chosen may depend on the operating temperature of the heat generating devices (i.e., the substrate 102) to be cooled.

It should be understood that the bonding assembly 300 may include various flow paths and configurations through the MIO structure 114, the cap structure 108, the cooling device 124, and the electrical isolation layer 126. Effectively, the flow of the cooling fluid 308 through the integrated fluid channel system 302 is configured to remove heat from the substrate 102. Accordingly, the MIO structure 114 may provide various benefits and functionalities for the bonding assembly 300, including but not limited to a thermal stress compensation layer between the substrate 102 and the cap structure 108, an electrically conductive path between various electrodes.

Figure 10:
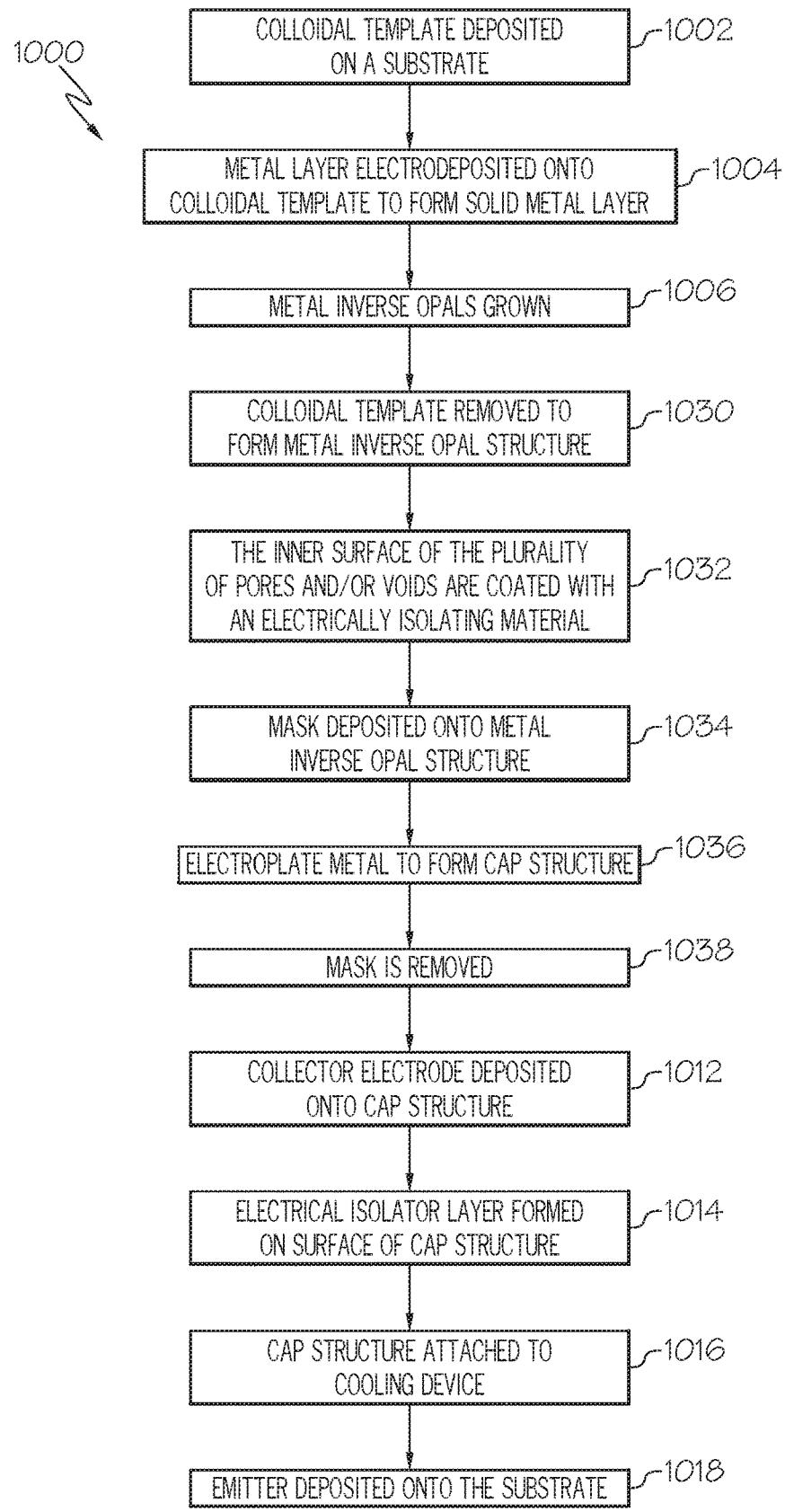

Referring now to FIG. 10 and still referring to FIGS. 7-9, an example method 1000 for forming the bonding assembly 300 generally described above will be described. It should be understood that method 1000 is merely illustrative and that the bonding assembly 300 may be formed in various other methods. Further, it should be understood that like steps in the method 1000 to the method 400 are increased in number by 600 and that these like steps are not discussed in detail again for brevity reasons.

It should be appreciated that steps 1002-1006 of the example method 1000 are identical to the steps 402-406 of the example method 400 (FIG. 4) and are not repeated here. Following the growing of the metal inverse opals, at step 1006, the colloidal template is removed from the metal inverse structure, at step 1030. Removing the colloidal template from the substrate forms the MIO structure within the bonding assembly. It should be understood that the colloidal template may be removed from the bonding assembly via various methods, including but not limited to, dissolving the colloidal template with a solution to thereby uncover the MIO structure formed within the porous structure of the colloidal template. In this instance, the top surface of the MIO structure is bonded to the bottom surface of the substrate.

As discussed above, the MIO structure includes a plurality of pores and/or voids that are interconnected to define a skeletal network of metal formed by the plurality of polymer spheres of the colloidal template. The MIO structure, formed of the metal, serves as an electrically conductive layer positioned between the substrate and the cap structure. Accordingly, it should be understood that the MIO structure may provide an electrically conductive path between the substrate and the cap structure. The skeletal network of metal of the MIO structure has a large surface area and the amount of porosity of the MIO structure may be varied during fabrication by changing the size of the plurality of polymer spheres of the colloidal template, varying the low current density, and the like as discussed above. Further, the size of the plurality of pores and/or voids of the MIO structure may be varied as a function of the thickness of the MIO structure such that a graded porosity, (i.e. graded pore diameter) is provided as a function of thickness. The size (diameter) of the plurality of pores and/or voids may vary. The MIO structure may be part of the integrated cooling channel assembly and configured to provide a pathway for the cooling fluid to remove heat from the substrate during operation of the bonding assembly. In particular, as noted above, the MIO structure includes the plurality of pores and/or voids disposed between the top surface and the bottom surface such that the MIO structure has an open porous structure through which the cooling fluid can flow through, thereby effectively removing heat from the substrate.

The inner surfaces of the plurality of pores and/or voids are coated with an electrically isolating material, at step 1032. In particular, the coating of the inner surfaces of the plurality of pores and/or voids may be by ALD, thermal oxidation, PECVD, and the like. It should be appreciated that the isolating material may generally be any material that is electrically non-conductive (e.g., an electrical insulator). The electrical isolation prevents the MIO structure from being electrically coupled to the cooling fluid flowing therethrough. Illustrative examples of isolating materials include, but are not limited to aluminum oxide, alumina, silicon dioxide ($SiO_2$), and/or the like At step 1034, a mask is deposited onto the MIO structure, in particular, on the bottom surface of the MIO structure. As discussed above, the mask is configured with a pattern that shapes material deposited within the bonding assembly into desired geometries. As such, in this embodiment, the mask, deposited onto the bottom surface of the MIO structure, includes patterns that define the inlet fluid channel and the outlet fluid channel of the integrated fluid channel system. With the mask deposited onto the MIO structure, the cap structure is provided, and in particular, the metal is electroplated to form the cap structure, at step 1036. In particular, the top surface of the cap structure may be electroplated onto the mask and, as such, also onto the bottom surface of the MIO structure thereby bonding the cap structure to the MIO structure along a surface opposite of the substrate.

The cap structure is formed from a high current density such that the cap structure is a solid structure or a solid film, as discussed in detail above. It should be appreciated that by varying the high current density, the metal, such as copper, that forms the cap structure is controlled to be a solid structure. Further the thickness of the cap structure may be controlled, the beginning point of the cap structure with respect to the plurality of pores and/or voids of the MIO structure may be controlled, and the like. In some embodiments, the cap structure may be bonded to the MIO structure via thermal bonding, transient liquid phase (TLP) bonding, electrolytic or electroless bonding, and/or the like.

With the cap structure deposited into the bonding assembly, the mask may be removed, at step 1038. Removing the mask from between the cap structure and the MIO structure directly bonds the cap structure to the MIO structure. The mask may be removed from the bonding assembly via various methods, including but not limited to, dissolving the mask with a solution to thereby uncover the inlet fluid channel and the outlet fluid channel of the integrated fluid channel system.

Once the mask is removed and the inlet fluid channel and the outlet fluid channel are defined in the cap structure, the collector electrode is deposited onto the cap structure, at step 1012, the electrical isolation layer is deposited on the cap structure, at step 1014, the cap structure is attached to the cooling device, at step 1016, and the emitter is deposited onto the substrate, at step 1018, in the exact manner as described with reference to steps 412, 414, 416, and 418 (FIG. 4) above. It should be appreciated that the electrical isolation layer and the cooling device are further configured to include the inlet fluid channel and the outlet fluid channel of the integrated fluid channel system, as described in greater detail above. In some embodiments, the collector electrode if formed from the cap structure, as described with reference to step 622 (FIG. 6) above.

It should be appreciated that the first example bonding assembly, the second example bonding assembly, and/or the third example bonding assembly provide for a solid cap structure and that allows heat to be removed from the substrate due to the MIO structure and current flow due to the MIO structure making contact with the substrate. Further, it should be appreciated that the cap structure of the first example bonding assembly, the second example bonding assembly, and/or the third example bonding assembly provide for a better adhesion between the continuous cap structure and the underlying substrate. Additionally, it should be appreciated that the third example bonding assembly permits for fluid cooling of the substrate though the pores of the MIO structure without the fluid making contact with the substrate resulting in less corrosion of the substrate and in an increase in the number of compatible power devices.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A method for forming an assembly, the method comprising:
   depositing a colloidal template onto a substrate, wherein the colloidal template is porous;
   depositing a metal layer onto and within the colloidal template to form the metal layer between the colloidal template and the substrate;
   depositing a cap structure onto the colloidal template opposite of the metal layer and the substrate, the cap structure formed by electroplating a material at least partially within and beyond a tallest level of the colloidal template in a system vertical direction;
   removing the colloidal template from between the metal layer and the cap structure to form a metal inverse opal structure disposed therebetween;
   depositing an electrical isolation layer in contact with the cap structure opposite the metal inverse opal structure; and
   attaching the electrical isolation layer to a cooling device, wherein the electrical isolation layer electrically isolates the substrate from the cooling device.

2. The method of claim 1, wherein the depositing of the metal layer onto and within the colloidal template is via electrodepositing with a metal.

3. The method of claim 2, wherein the metal is a copper that forms copper inverse opals.

4. The method of claim 1, further comprising depositing a collector electrode attached on the cap structure.

5. The method of claim 4, wherein depositing the collector electrode comprises electrodepositing the collector electrode on the cap structure.

6. The method of claim 4, wherein depositing the collector electrode comprises spot welding the collector electrode on the cap structure.

7. The method of claim 1, wherein the cooling device is a heatsink.

8. The method of claim 7, wherein:
   the cooling device is a manifold in fluid communication with a surface of the substrate via an integrated fluid channel system comprising:
      an inlet fluid channel, and
      an outlet fluid channel,
      wherein the inlet fluid channel and the outlet fluid channel are in fluid communication through the metal inverse opal structure.

9. The method of claim 1, wherein the substrate is a power electronics device.

10. A method for forming a power electronic assembly, the method comprising:
    depositing a colloidal template onto a substrate, wherein the colloidal template is porous;
    electrodepositing a metal layer onto and within the colloidal template to be in contact with the substrate and the colloidal template;
    removing the colloidal template from the substrate to form a metal inverse opal structure having a plurality of pores;
    coating an inner surface of each of the plurality of pores with an electrical isolating material;
    depositing a mask onto a surface of the metal inverse opal structure opposite of the surface in contact with the substrate;
    electroplating a cap structure onto the mask and the metal inverse opal structure;
    depositing a collector electrode attached onto a side surface of the cap structure to extend from the cap structure; and
    removing the mask to form an integrated fluid channel system.

11. The method of claim 10, further comprising:
    depositing an electrical isolation layer in contact with the cap structure opposite the metal inverse opal structure; and
    attaching the electrical isolation layer to a cooling device, wherein the collector electrode is spaced apart from the cooling device.

12. The method of claim 10, wherein the metal inverse opal structure is a copper inverse opal structure.

13. The method of claim 11, wherein:
    the cooling device is a manifold configured to be in fluid communication with the integrated fluid channel system; and
    a cooling fluid is directed through the manifold and the integrated fluid channel system to make contact with a surface of the substrate and the metal inverse opal structure.

14. The method of claim 10, wherein the collector electrode is deposited on the cap structure by electrodepositing the collector electrode on the cap structure or spot welding the collector electrode on the cap structure.

15. The method of claim 10, wherein the substrate is a power electronics device.

* * * * *